United States Patent [19]

Dent

[11] Patent Number: 5,423,074
[45] Date of Patent: * Jun. 6, 1995

[54] AM-FM TRANSMITTER POWER AMPLIFIER

[75] Inventor: Paul W. Dent, Stehag, Sweden

[73] Assignee: Ericsson GE Mobile Communications Inc., Research Triangle Park, N.C.

[*] Notice: The portion of the term of this patent subsequent to Nov. 1, 2011 has been disclaimed.

[21] Appl. No.: 225,709

[22] Filed: Apr. 11, 1994

Related U.S. Application Data

[63] Continuation of Ser. No. 61,345, May 17, 1993, Pat. No. 5,361,403, which is a continuation of Ser. No. 612,495, Nov. 14, 1990, abandoned.

[51] Int. Cl.⁶ .......................... H04B 1/40; H04B 1/04; H03G 1/04
[52] U.S. Cl. ......................... 455/74; 455/93; 455/126; 455/127; 330/129; 330/145; 375/216
[58] Field of Search ............... 330/129, 149, 279, 281, 330/298, 284, 207 P, 141, 144, 145; 332/149, 159; 455/126, 127, 113, 115, 102, 116, 107, 117, 341, 129, 74, 89, 54.1; 379/58, 59, 390, 403; 375/5, 7, 98, 60, 74, 40; 370/11

[56] References Cited

U.S. PATENT DOCUMENTS

| | | |
|---|---|---|
| 3,378,773 | 4/1968 | Jeffers . |
| 3,588,701 | 6/1971 | Kahn . |
| 3,970,786 | 7/1976 | Randmere ............... 379/390 |
| 4,034,308 | 7/1977 | Wermuth et al. . |
| 4,066,976 | 1/1978 | Dickopp et al. . |
| 4,229,826 | 10/1980 | Wanzer . |
| 4,257,009 | 3/1981 | Yorkanis . |
| 4,441,082 | 1/1984 | Haque . |
| 4,446,440 | 5/1984 | Bell . |
| 4,502,025 | 2/1985 | Carl, Jr. et al. . |
| 4,592,073 | 5/1986 | Watanabe . |
| 4,673,886 | 6/1987 | Bickley et al. ........... 330/207 P |
| 4,715,046 | 12/1987 | True, III et al. . |
| 4,723,306 | 2/1988 | Fuenfgelder et al. . |
| 4,742,540 | 5/1988 | Schingh . |
| 4,901,032 | 2/1990 | Komiak . |
| 4,924,191 | 5/1990 | Erb et al. . |
| 4,955,083 | 9/1990 | Phillips et al. . |
| 4,994,757 | 2/1991 | Bickley et al. ............ 455/126 |
| 4,994,757 | 2/1991 | Bickley et al. ............ 455/126 |
| 5,054,116 | 10/1991 | Davidson . |
| 5,060,294 | 10/1991 | Schwent et al. . |
| 5,066,922 | 11/1991 | Leitch ................... 455/126 |

FOREIGN PATENT DOCUMENTS 58-46709(A) 3/1983 Japan .

OTHER PUBLICATIONS

Microelectronics Digital and Analog Circuits and Systems, Millman, McGraw Hill Book Company, 1979, pp. 40–41.

Kohl et al. "Pamela-A New Method for Linear and Efficient Power Amplification" Conf. Proc. 20th European Microwave Conference 90, pp. 310–315, Sep. 10, 1990.

Primary Examiner—Reinhard J. Eisenzopf
Assistant Examiner—Lisa Charouel
Attorney, Agent, or Firm—Burns, Doane, Swecker & Mathis

[57] ABSTRACT

A power amplifier used in a portable, radio frequency transmitter is switched between different modes of operation when transmitting differently modulated carriers. The first mode of operation corresponds to amplitude modulation (AM), while a second mode corresponds to angle modulation techniques such as frequency modulation (FM). A switching network alters the impedance of the power amplifier to match network for matching the impedance of the transmitter antenna in order to achieve maximum efficiency in each mode of operation. Various switching methods and impedance matching circuits are disclosed.

6 Claims, 4 Drawing Sheets

AM-FM TRANSMITTER POWER AMPLIFIER

This application is a continuation of application Ser. No. 08/061,345, filed May 17, 1993 now U.S. Pat. No. 5,361,403, which is a continuation of Ser. No. 07/612,495, filed Nov. 14, 1990, now abandoned.

FIELD OF THE INVENTION

The present invention relates to radio frequency transmitter power amplifiers, and more particularly, to transmitters which efficiently amplify carrier signals modulated by different modulation techniques.

BACKGROUND OF THE INVENTION

Radio transmission of information signals takes place by modulating the information signals on a radio frequency (RF) wave known as the RF carrier. Common modulation methods include Amplitude Modulation (AM), Frequency Modulation (FM), and Phase Modulation (PM). In AM, the amplitude or strength of the RF carrier is varied in relation to the information signal, while the freqency of the carrier itself remains constant. In FM and PM, the frequency and phase, respectively, of the RF carrier are varied while the amplitude remains constant.

For constant amplitude modulation techniques, such as FM and PM, efficient radio frequency transmitters of simple construction may be designed to achieve maximum efficiency at a single, constant amplitude. In contrast, because the RF carrier amplitude varies considerably in amplitude modulation, efficient AM transmitters are more difficult to construct and are usually less efficient than constant amplitude transmitters. For complex modulation schemes, such as Single Side Band (SSB) and Quadrature Phase Shift Keying (QPSK), where both the amplitude and the phase of the carrier are modulated, transmitters capable of transmitting complex modulated signals are the most difficult to construct. Consequently, when a single transmitter is designed to transmit signals that in a first mode are constant amplitude FM or PM signals, and a second mode are amplitude modulated or complex modulated signals, the provision of an amplitude modulation capability for the second mode adversely affects the transmitter efficiency in the first mode.

The conventional solution for efficiently generating a high-power, amplitude modulated signal is to amplify a low frequency, modulating signal initially to a high power level up to half of the transmitter mean output power. The high power modulating signal is added in series with a DC power supply to the transmitter power amplifier in order to produce a modulated power supply voltage and hence a modulated power output. This procedure is called high-level modulation.

Of the various classes of power amplifiers, Class A, AB, B, or C, RF power amplifiers using high-level modulation operate at maximum efficiency in the non-linear, Class C mode of operation. However, the penalty for obtaining high amplifier efficiency is that transmitters that use high level modulation are large, heavy, and costly.

In applications where size, weight or cost considerations are more important than efficiency, such as portable, radiotelephone transmitters, low-level modulation techniques must be used. Low-level modulation techniques initially amplify the carrier to a low power level at which amplifier efficiency is immaterial. After the carrier is modulated, however, it must be amplified to a high power level using a linear power amplifier. Unfortunately, only lower efficiency Class A, AB, or B power amplifiers are capable of reasonably linear operation. Thus, high efficiency, Class C amplifiers can not be used in mobile radiotelephone transmitters that employ low-level amplitude modulation.

Class A amplifiers conduct current for an entire input cycle and therefore consume power continuously even when output power is not required. As is well known, the maximum theoretical efficiency of a Class A amplifier at full output power is 50%. However, because AM signals operate at a mean power equal to $\frac{1}{4}$ the peak output power, the maximum theoretical efficiency at mean output power is only 12.5%. The failure to reduce power consumption for a corresponding reduction in power required results in this low efficiency. Fortunately, this disadvantage is partially overcome by a Class B amplifier.

Conventional, Class B amplifiers include two identical amplifiers arranged in a push-pull fashion and biased so that current is not consumed when output power is not required. When a sinusoidal, RF input signal enters a positive cycle, one of the amplifiers conducts current. Similarly, the other amplifier conducts current on the subsequent negative half cycle. Thus, each amplifier amplifies one-half of the sine-shaped current signal such that the mean output current equals 1/Pi times the peak output current. Accordingly, the total mean current for both amplifiers is 2/Pi times the peak output current. As the RF input signal level increases, the current delivered to the load increases proportionally until the output voltage developed across the load impedance is equal to the power supply voltage. At this point, any further increase in the RF input signal drives the amplifier into saturation. For linear modulation, driving the power amplifier into saturation distorts the modulated signal. For this reason, the amplifier must not be driven into saturation.

To achieve maximum efficiency in Class B, linear power amplifiers, the amplifier must be operated at the point just before saturation where voltage across the load equals the power supply voltage. The ratio of the output power to the power consumed at peak output current results in the theoretical maximum efficiency of Pi/4 or 78.5%. At less than peak amplitude, however, efficiency is determined based on two factors: (1) power consumption decreases in proportion to the output voltage and (2) power output decreases in proportion to the square of the output voltage. Consequently, the efficiency decreases linearly with the output voltage or amplitude. At a mean output voltage equal to one-half of the peak output voltage, the mean efficiency is equal to one-half the peak efficiency, i.e., 0.5 Pi/4 or 39%.

As is evident from the description above, the efficiency of Class B amplifiers is considerably better than that of Class A amplifiers at mean amplitude output level. The efficiency improves because Class B amplifiers reduce current consumption in proportion to the power demand. Nonetheless, the mean amplitude efficiency of 39% for AM transmission is low compared to the peak amplitude/full output efficiency of 78.5% for constant amplitude modulation.

The problem addressed by the present invention is the construction of a power amplifier that transmits both amplitude modulated and angle modulated signals at the same mean power output level without a significant reduction in efficiency. For example, if a Class B amplifier is used to transmit a one-watt carrier using AM transmission, the amplifier must amplify the modulation peaks so that four watts of peak power is output. If the same amplifier is then used to transmit a one-watt carrier using FM transmission, its efficiency would only be 39% instead of the 78.5% theoretically possible for FM transmissions. On the other hand, if the full power of 4 watts is used in the FM mode, the efficiency would be 78.5%, but the total power consumption would rise to twice that consumed in the 1-watt situation.

In battery-operated equipment, such as handheld radiotelephones, operating the power amplifier either at reduced power and half efficiency or at full power and full efficiency, has an equally negative impact on battery life. Therefore, a goal of the present invention is to construct an efficient power amplifier circuit that efficiently transmits AM signals at one power level and efficiently transmits angle modulated signals at other power levels.

SUMMARY OF THE INVENTION

A power amplifier of a type that is suitable for use in a portable, radio frequency transmitter is switched between different modes of operation when transmitting differently modulated carriers. The first mode of operation corresponds to amplitude modulation (AM), while a second mode corresponds to constant amplitude modulation techniques, such as frequency modulation (FM). A switching network alters the impedance of the power amplifier to match the impedance of the tranmitter antenna in order to achieve maximum efficiency in each mode of operation. Various switching methods and impedance matching circuits are disclosed.

BRIEF DESCRIPTION OF THE DRAWINGS

These and other features and advantages of the invention will be readily apparent to one of ordinary skill in the art from the following description, read in conjunction with the drawings, in which.

DETAILED DESCRIPTION OF THE PREFERRED EMBODIMENTS

In the following description of preferred embodiments, a system of the type that can be used to implement the present invention will be described. It will be appreciated, however, that specific applications of the invention are not limited to this particular system or to portable radio transmitters. Rather, the present invention is applicable to any situation where it is desirable to transmit RF signals using different modulation methods at maximum efficiency.

As described in the background of the invention, maximum efficiency in Class B, linear power amplifiers is achieved just before saturation of the amplifier when the output voltage developed across the load is equal to the full supply voltage. The power output $P_O$ at the saturation point is:

$$P_O = 0.5 \, V_O^2 / R_L;$$

where $R_L$ is the load resistance presented to the power amplifier and $V_O$ is the peak voltage the amplifier can deliver. In the preferred embodiment, the load is the antenna impedance of a portable radiotelephone. Because the antenna impedance cannot be changed, a variable impedance matching network is located between the power amplifier and the antenna.

Figure 1:
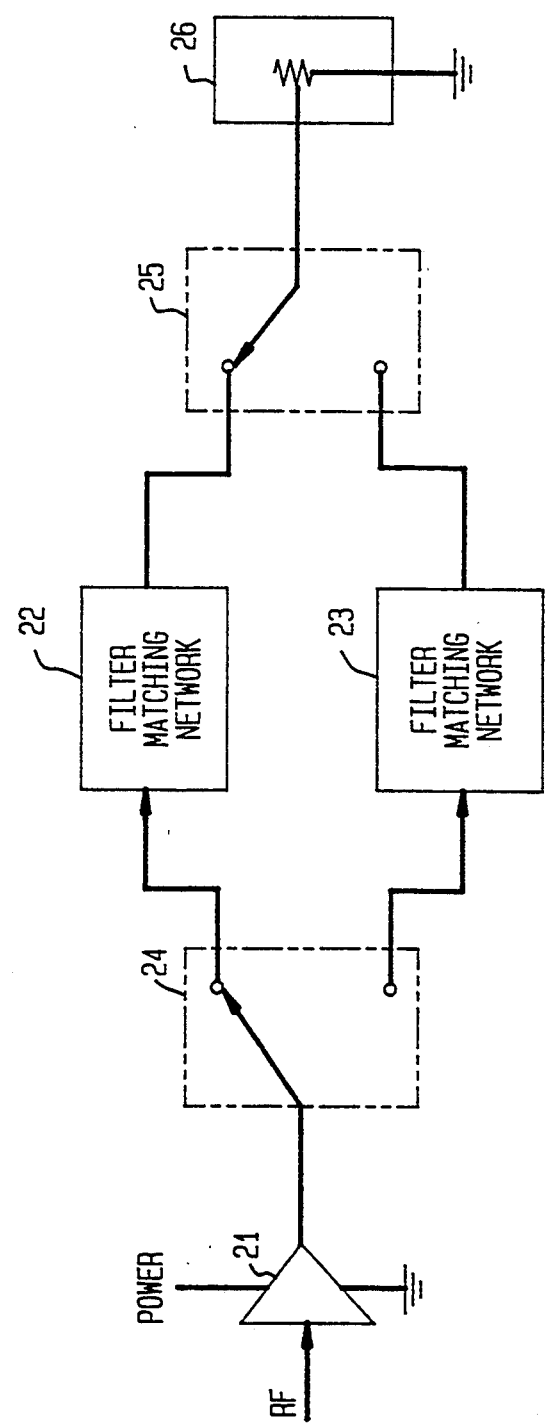
FIG. 1 is a function block diagram of a circuit for implementing the present invention.

FIG. 1 shows one technique according to the present invention for varying the source impedance using impedance matching filter networks 22 and 23. A modulated, RF carrier is received by a power amplifier 21 for amplification to a power level suitable for radio frequency transmission. The power amplifier 21 is supplied with voltage from an external power supply, not shown. A switch 24 connects the output signal of the power amplifier 21 to one of the two impedance matching networks 22 and 23. A switch 25 connects output signals from either of the impedance matching networks 22 and 23 to an antenna or other load impedance 26. The switches 24 and 25 may be any conventional, electrical or electronic switch and may be actuated manually or automatically.

The impedance matching network 22 is used for a linear, Class B mode of operation of the power amplifier 21 at a first output level required for amplitude modulated (AM) or complex modulated transmissions. The impedance matching network 23 is used for a Class B or Class C mode of operation of the power amplifier 21 at a different level of output power corresponding to constant amplitude modulation transmissions. Each of the impedance matching networks may be designed independently, using techniques well known to those of ordinary skill in transmitter design art, to achieve maximum efficiency at the respective peak power levels associated with the varying amplitude modulation and constant amplitude modulation transmission modes. For example, the network 22 may be a fixed-filter network for transforming the antenna impedance 26 to a convenient impedance $Z_a$ or to a convenient admittance $Y_a$. Such a filter network 22 may also be used to attenuate undesirable harmonics or signals interfering at certain frequencies. The second, impedance matching network 23 may also be a fixed-filter network.

Figure 2:
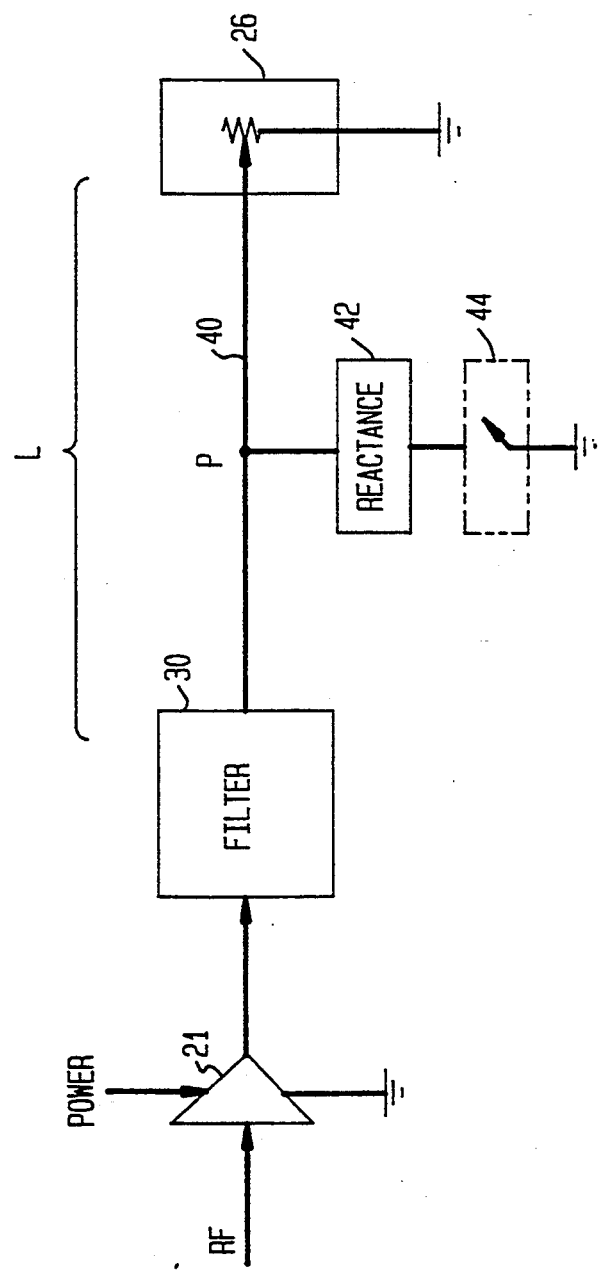
FIG. 2 is a circuit diagram of an impedance matching circuit that can be used in one embodiment of the present invention.

In one preferred embodiment of the present invention, the impedance matching networks 22 and 23 between the power amplifier 21 and the antenna or load 26 may be reduced to a single switching unit 44 as illustrated in FIG. 2. A purpose of the present invention, as depicted in FIG. 2, is to present alternative load impedances to the power amplifier 21 depending on whether the switch 44 is activated. These alternative impedances are designed to equal, respectively, the optimum load impedance for the desired peak power in the varying amplitude modulation mode and the optimum load impedance for the desired power in the constant amplitude modulation mode. In contrast, the aim of an impedance matching network in the prior art is to present a single load impedance to the power amplifier that provides optimum efficiency under the assumption that there is only one type of modulation and only one power level.

Returning to FIG. 2, the power amplifier 21 is connected to a load impedance or antenna 26 through a filter network 30 by a length L of the transmission line 40. The filter network 30 filters undesirable radiation generated by harmonics at the carrier operating frequency caused by non-linearities in the power amplifier 21. At some point P along the length of transmission line 40, a reactance 42 may be switched in parallel with the load impedance 26 by means of a switch 44. The reactance 42 may be a capacitance, an inductance, or a transmission line stub. If a transmission line stub is used, both the stub and the transmission line can be fabricated as a conductor pattern on a multi-layer, printed circuit board or the like. The switch 44 may be a relay, a mechanically-actuated contact, or an electric switch, such as a PIN diode or suitable transistor.

Figure 3:
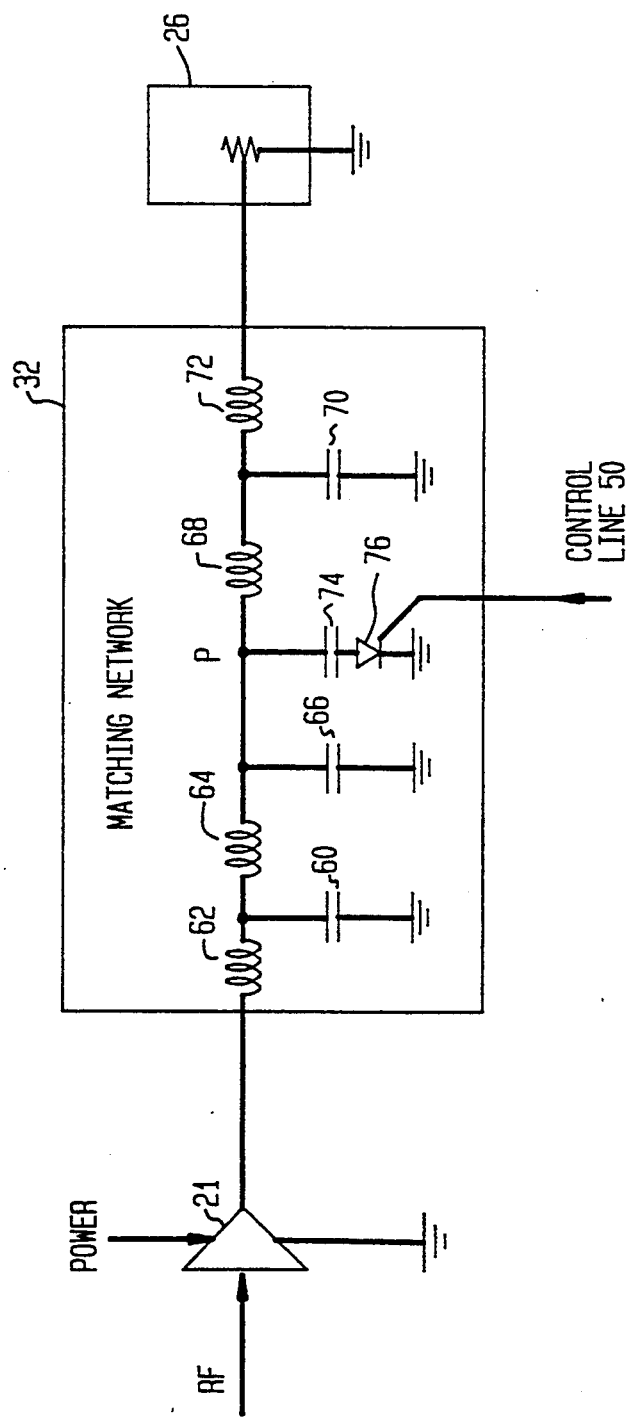
FIG. 3 is a circuit diagram of an impedance matching circuit for use in another embodiment of the present invention.

In another preferred embodiment of the present invention, a harmonic filter network 32 is located between the power amplifier 21 and the load impedance 26 as shown in FIG. 3. The filtering network 32 includes a number of lossless reactances 60, 62, 64, 66, 68, 70, 72, and 74 in the form of capacitors and inductors. These reactances are usually fixed and designed to minimize the loss to the desired signal at a particular transmission frequency. In conventional applications of the filtering network 32, these reactances are switched to change the operating frequency of a harmonic filter or an antenna matching network. However, in this preferred embodiment according to the present invention, at least one switched or otherwise variable reactance element 74 is introduced into the matching network by a switch 76 or other reactance variance device controlled by a control line 50. The control line 50 may be connected to a manual switch or to a suitable control device for automatic control. The reactance element 74 may have a fixed or variable reactance. One example of a variable reactance is a varactor diode. Otherwise, a fixed reactance 74 may be switched into the network by a manual switch or electronic switch such as a PIN diode.

The switched or variable reactance element 74 is used to vary the load impedance in order to obtain a different power output level and still maintain a high efficiency. The magnitude of the switched reactance element 74 as well as the other reactances within the matching networks 32 are selected so that in a first modulation mode, when the switch 76 is open, the load impedance is a resistive load impedance $R_1$. In the second modulation mode, corresponding to the switch 76 being closed, the overall load impedance is a resistive impedance $R_2$. The resistive load impedances $R_1$ and $R_2$ are selected with respect to the power supply voltage to obtain two distinct power output levels at maximum efficiency in both of the constant amplitude modulation and the amplitude modulation modes.

Because switching a resistance/conductance into the circuit simply absorbs power and reduces efficiency, the antenna impedance must be changed by switching a lossless reactance/susceptance into or out of the circuit. Consequently, the filter network 32 must be designed such that a change in susceptance switched across point P to ground results in a change of resistance from $R_1$ to $R_2$ as seen by the power amplifier 21.

At the output terminal of the power amplifier 21, the load impedances for optimum efficiency are complex, i.e., Z1 and Z2. However, these impedances may be assumed to be resistances R1 and R2 at some point, even if that point is imaginary point or unaccessible, e.g., inside the power amplifier 21. In the design of the present invention, that assumption is a reasonable one.

Figure 4:
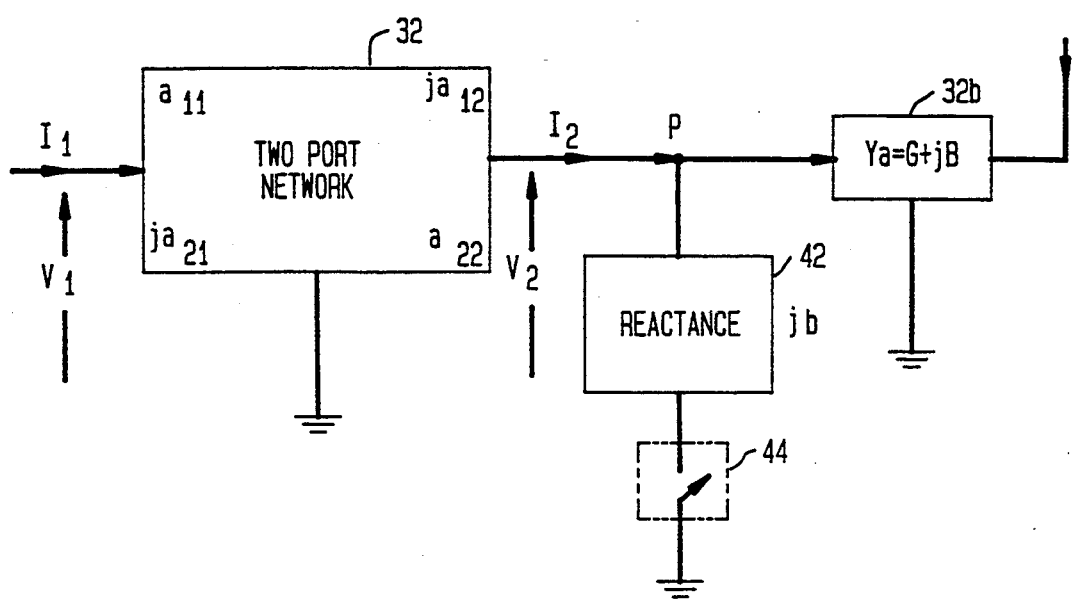
FIG. 4 is a general network schematic representing the output impedance seen by the power amplifier.
Figure 5:
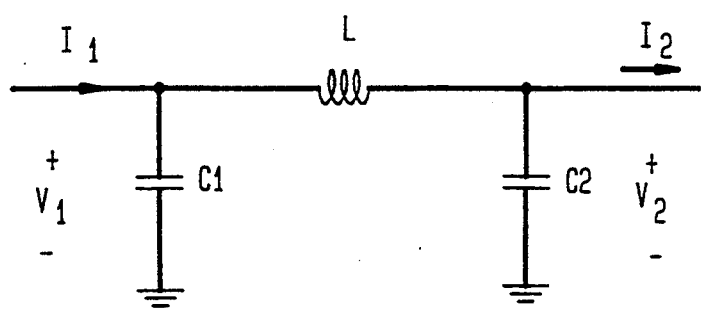
FIG. 5 is a two-port schematic of the network shown in FIG. 1.

Referring now to FIGS. 4 and 5, the design of the present invention is based on a two port model of the filter network 32. While the reactance (jb) 42 and the switch 44 are a part of the network 32, they have been shown separately for illustration purposes. The filter design is determined from the chain matrix of the two port network 32 which can be defined by:

$$\begin{vmatrix} V1 \\ I1 \end{vmatrix} = \begin{vmatrix} a11 & a12 \\ a21 & a22 \end{vmatrix} \begin{vmatrix} V2 \\ I2 \end{vmatrix}$$

It is known that the chain matrix of a passive, reciprocal network, such as the filter network 32, has a unity determinant, that is $$det(A) = (a11)(a22) - (a12)(a21) = 1$$

Furthermore, it is known that, for a lossless network, a11 and a22 must be real, and a12 and a21 must be imaginary. Therefore, the chain matrix can be rewritten as:

$$\begin{vmatrix} a11 & ja12 \\ ja21 & a22 \end{vmatrix}$$

By reciprocity, $$det(A) = (a11)(a22) + (a12)(a21) = 1.$$

When the two-port network 32 terminates at the point P, i.e., with the reactance jb switched out, the antenna admittance as modified by the filter network 32 is $Ya = G + jB$. Accordingly, because:

$$I2 = (V2)(Ya)$$

the input impedance R1 of the network seen by the power amplifier 21 is:

$$R1 = V1/I1 = \frac{a11 + (ja12)(Ya)}{ja21 + (a22)(Ya)} \quad (1)$$

Equation (1) is then set to be equal to the actual value of the desired load resistance R1 in the first modulation mode.

When the switch 44 is closed, an extra susceptance (jb) 42 is connected in parallel with the admittance Ya at point P modifying it to Ya+jb. In the second modulation mode, the impedance seen by the power amplifier 21 must now be equal to R2 and is given by:

$$R2 = \frac{a11 + (ja12)(Ya + jb)}{ja21 + (a22)(Ya + jb)} \quad (2)$$

Manipulating equations 1 and 2 into separate equations for the real and imaginary parts result in:

$$a11 - (B)(a12) - (R1)(G)(a22) = 0$$

$$(G)(a12) - (R1)(a21) - (B)(R1)(a22) = 0$$

$$a11 - (B+b)(a12) - (R2)(G)(a22) = 0$$

$$(G)(a12) - (R2)(a21) - (B+b)(R1)(a22) = 0$$

which can be written in matrix form as:

$$\begin{vmatrix} 1 & -B & 0 & -R1G \\ 1 & -(B+b) & 0 & -R2G \\ 0 & G & -R1 & -BR1 \\ 0 & G & -R2 & -(B+b)R2 \end{vmatrix} \begin{vmatrix} a11 \\ a12 \\ a21 \\ a22 \end{vmatrix} = \begin{vmatrix} 0 \\ 0 \\ 0 \\ 0 \end{vmatrix} \quad (3)$$

Since the right hand side of the equation is zero, a non-trivial solution is possible only if the determinant of the matrix is also zero. Because rows and/or columns of a determinant can be subtracted from each other without altering the determinant's value, we subtract row 1 from row 2 to obtain a simpler determinant:

$$\begin{vmatrix} 1 & -B & 0 & -(R1)(G) \\ 0 & -b & 0 & -(R2-R1)(G) \\ 0 & G & -R1 & -(B)(R1) \\ 0 & G & -R2 & -(B+b)(R2) \end{vmatrix} = 0$$

The simplified matrix may be multiplied resulting in the equation:

$$-(R1)(R2)(b^2) + G(R2-R1)^2 = 0$$

Solving this equation for the switched susceptance b yields $$b = \pm(G)(R2-R1)/sqrt(R1R2)$$

Substituting b in the matrix and dividing both sides by a11 results in the following matrix equations:

$$\begin{vmatrix} 1 & -B & 0 & -(R1)(G) \\ 0 & -b & 0 & -(R2-R1)(G) \\ 0 & G & -R1 & -(B)(R1) \\ 0 & G & -R2 & -(B+b)(R2) \end{vmatrix} \begin{vmatrix} 1 \\ a12/a11 \\ a21/a11 \\ a22/a11 \end{vmatrix} = \begin{vmatrix} 0 \\ 0 \\ 0 \\ 0 \end{vmatrix}$$

From the first three equations (1)—(3), by taking the constant term 1 to the right hand side and changing signs resulting in:

$$\begin{vmatrix} B & 0 & (R1)(G) \\ b & 0 & (R2-R1)(G) \\ -G & R1 & (B)(R1) \end{vmatrix} \begin{vmatrix} a12/a11 \\ a21/a11 \\ a22/a11 \end{vmatrix} = \begin{vmatrix} 1 \\ 0 \\ 0 \end{vmatrix}$$

which can be solved to give $$a12/a11 = p$$

i.e.

$$a12 = p \, a11$$

$$a21 = q \, a11$$

$$a22 = r \, a11$$

Substituting in the reciprocity condition $a11a22 + a12a21 = 1$ results in:

$$(r+pq)a11^2 = 1 \text{ and}$$

$$a11 = 1/sqrt(r+pq).$$

Hence a11, a12, a21, and a22 are determined.

At this point, a network with these chain matrix parameters must be determined. There is an infinite number of possible networks which have these same chain matrix parameters at one frequency. One simple example is a Pi network consisting of a series inductor L from port 1 to port 2, with a capacitor C1 from port 1 to ground and a capacitor C2 from port 2 to ground as illustrated in FIG. 5. The chain matrix for such a Pi network is $$\begin{vmatrix} 1-(w^2)(L)(C2) & jwL \\ jw(C2)(1-(w^2)(L)(C1)) & 1-(w^2)(L)(C1) \end{vmatrix}$$

Equating wL to a12, L equals a12/w. Equating $1-(w^2)(L)(C2)$ to a11, C1 is calculated using $(1-a11)/wa12$. Likewise, C2 is calculated using $(1-a22)/(wa12)$. The fourth element a12 is determined by virtue of the constraint $(a11)(a22) + (a12)(a21) = 1$.

If during the above procedure any negative component values should arise, the other sign of the susceptance b should be selected and the procedure repeated. In the case of transmission line networks, those skilled in the art may alternatively perform the design manually using Smith's Chart or semi-manually using one of a variety of computer-aided design programs such as Touchtone or Super Compact.

The invention has been described in terms of specific embodiments to facilitate understanding. The above embodiments, however, are illustrative rather than limitive. It will be readily apparent to one of ordinary skill in the art that departures may be made from the specific embodiments described above without departing from the essential spirit and scope of the invention. Therefore, the invention should not be regarded as being limited to the illustrated embodiments, but should be regarded instead as being fully commensurate in scope with the following claims.

WHAT IS CLAIMED IS:

1. A transmitter for selectively modulating a carrier signal using a variety of modulation techniques, comprising:
   a power amplifier having an input for a signal to be amplified and an output for supplying an amplified signal;
   a load impedance connected to said amplifier output for receiving the amplified signal; and
   means for varying said load impedance based on a parameter that depends on the selected modulation technique,
   wherein the power amplifier maintains a linear mode of operation when the selected modulation technique is alternatively amplitude modulation, complex modulation, and constant amplitude modulation.

2. The transmitter as defined in claim 1, wherein said modulation techniques include:
   frequency modulation, the amplitude modulation, phase modulation, and the complex modulation.

3. The transmitter as defined in claim 1, wherein said parameter further depends on a power transmission level of said power amplifier.

4. The transmitter as defined in claim 1, wherein said means for varying said impedance includes a variable reactance.

5. The transmitter as defined in claim 1, wherein said load impedance includes a plurality of matching circuits and said impedance varying means switchably connects one of said matching circuits to said amplifier.

6. The transmitter as defined in claim 1, wherein said load impedance includes a plurality of harmonic filter components and said impedance varying means to switchably connects at least one of said harmonic filter components to said amplifier.

* * * * *